US010038119B2

(12) United States Patent
Lee

(10) Patent No.: US 10,038,119 B2
(45) Date of Patent: Jul. 31, 2018

(54) LIGHT EMITTING DEVICE, LIGHT EMITTING DEVICE PACKAGE, LIGHT UNIT, AND METHOD OF MANUFACTURING SAME

(71) Applicant: LG INNOTEK CO., LTD., Seoul (KR)

(72) Inventor: Keon Hwa Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/539,277

(22) PCT Filed: Dec. 24, 2015

(86) PCT No.: PCT/KR2015/014276
§ 371 (c)(1),
(2) Date: Jun. 23, 2017

(87) PCT Pub. No.: WO2016/105167
PCT Pub. Date: Jun. 30, 2016

(65) Prior Publication Data
US 2017/0352785 A1    Dec. 7, 2017

(30) Foreign Application Priority Data

Dec. 24, 2014 (KR) ........................ 10-2014-0187918

(51) Int. Cl.
*H01L 33/36* (2010.01)
*H01L 33/54* (2010.01)
(Continued)

(52) U.S. Cl.
CPC ........ *H01L 33/36* (2013.01); *H01L 21/28512* (2013.01); *H01L 29/16* (2013.01);
(Continued)

(58) Field of Classification Search
CPC ... H01L 33/36; H01L 21/28512; H01L 29/16; H01L 33/54; H01L 29/66136; H01L 21/2053; H01L 21/182; H01L 33/56
See application file for complete search history.

(56) References Cited

U.S. PATENT DOCUMENTS 8,957,444 B2 * 2/2015 Sugizaki ............... H01L 25/167
257/98
2013/0119424 A1    5/2013 Kang et al.
(Continued)

FOREIGN PATENT DOCUMENTS

| KR | 10-2004-0063851 A | 7/2004 |
| KR | 10-2012-0004876 A | 1/2012 |
| KR | 10-2013-0054041 A | 5/2013 |

OTHER PUBLICATIONS

International Search Report, issued in PCT/KR2015/014276, dated Apr. 22, 2016.

*Primary Examiner* — David Vu
(74) *Attorney, Agent, or Firm* — Birch, Stewart, Kolasch & Birch, LLP

(57) ABSTRACT

The embodiment relates to a light emitting device, a method of fabricating the same, a light emitting device package, and a lighting system. According to the embodiment, a light emitting device includes a light emitting structure including a first conductive semiconductor layer, an active layer, a second conductive semiconductor layer, a first electrode electrically connected with the first conductive semiconductor layer, a second electrode electrically connected with the second conductive semiconductor layer, an insulating member provided on the light emitting structure while exposing the first electrode and the second electrode, a third electrode provided on the first electrode, and a fourth electrode provided on the second electrode. The third electrode includes a first part of the third electrode directly making (Continued)

contact with the first electrode and a second part of the third electrode, which is provided on the first part of the third electrode and has a horizontal width wider than the first part of the third electrode, and the fourth electrode includes a first part of the fourth electrode directly making contact with the second electrode and a second part of the fourth electrode, which is provided on the first part of the fourth electrode and has a horizontal width wider than the first part of the fourth electrode. The light extraction efficiency and the heat radiation characteristic may be improved, and the reliability may be improved.

20 Claims, 9 Drawing Sheets

(51) Int. Cl.
*H01L 29/16* (2006.01)
*H01L 21/285* (2006.01)
*H01L 33/56* (2010.01)
*H01L 21/18* (2006.01)
*H01L 21/205* (2006.01)
*H01L 29/66* (2006.01)

(52) U.S. Cl.
CPC ............ *H01L 33/54* (2013.01); *H01L 21/182* (2013.01); *H01L 21/2053* (2013.01); *H01L 29/66136* (2013.01); *H01L 33/56* (2013.01)

(56) References Cited

U.S. PATENT DOCUMENTS

2013/0119429 A1   5/2013  Yeh et al.
2014/0093990 A1   4/2014  Chen et al.

\* cited by examiner

[FIG. 1]
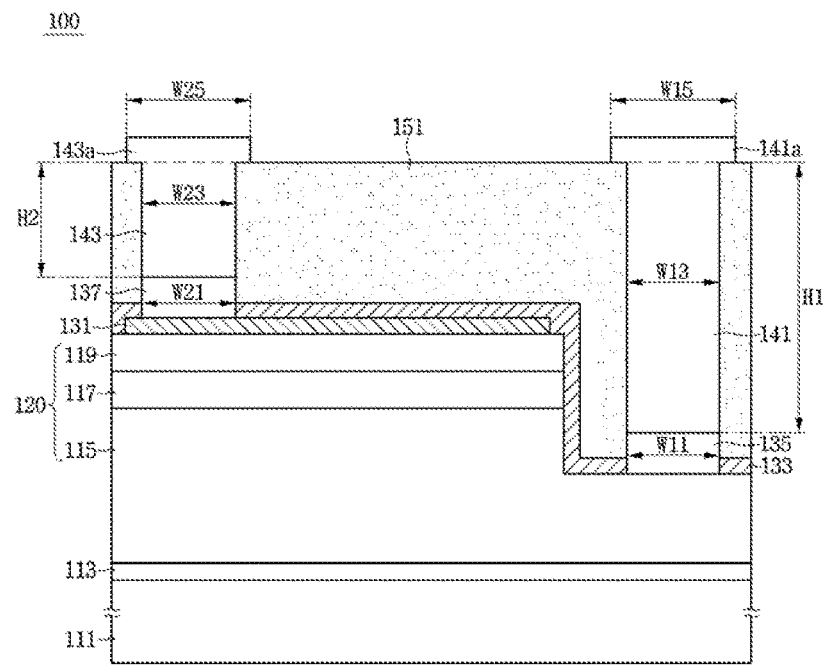
[FIG. 2]
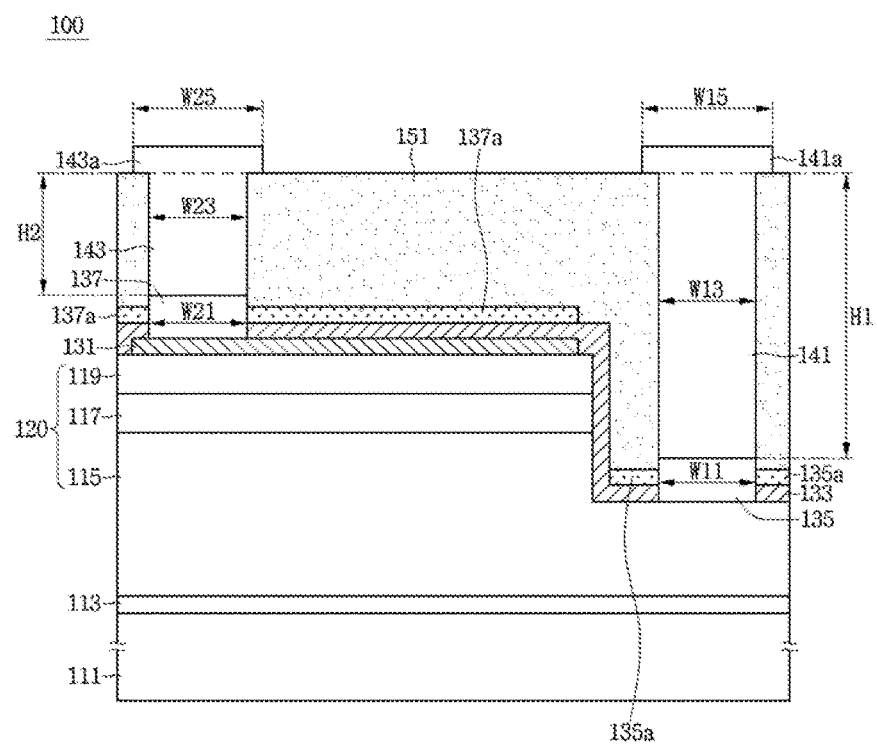

[FIG. 3]
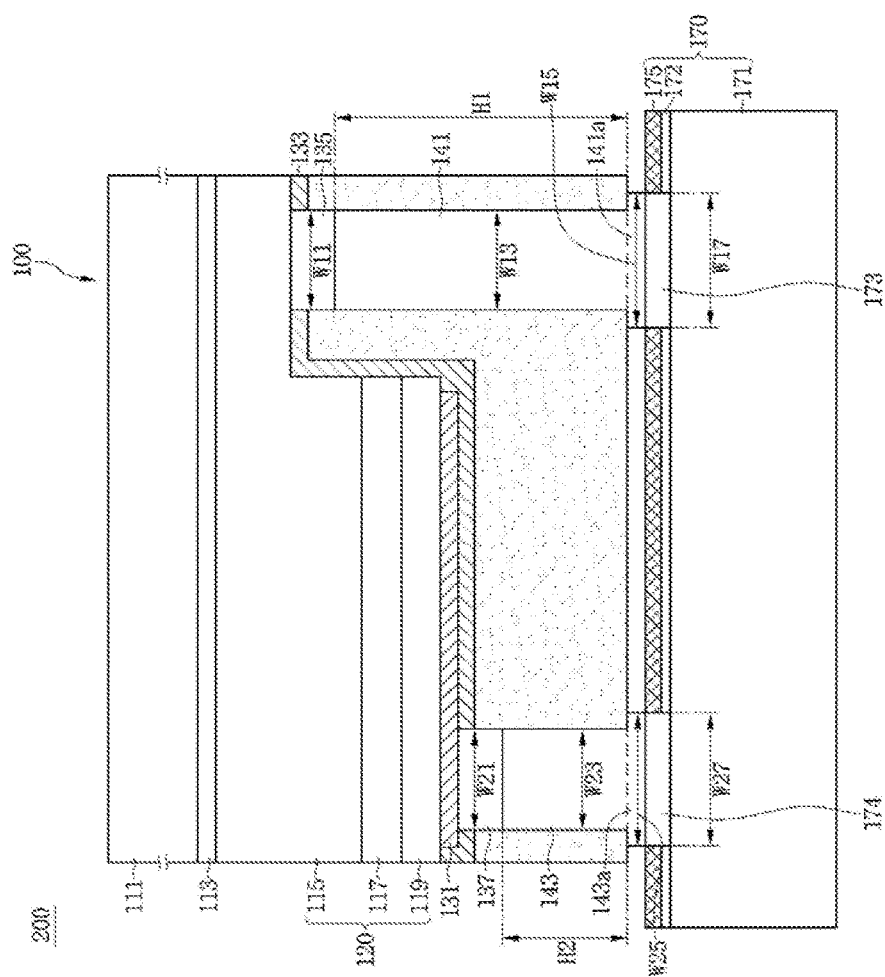

[FIG. 4]
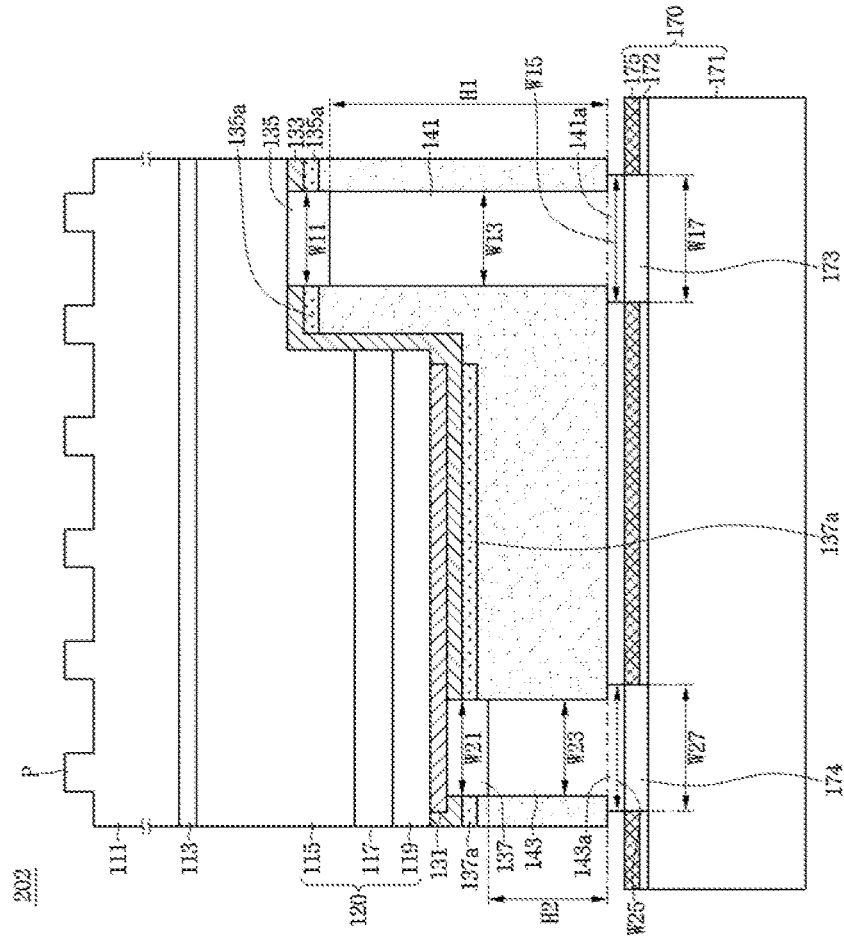
[FIG. 5]
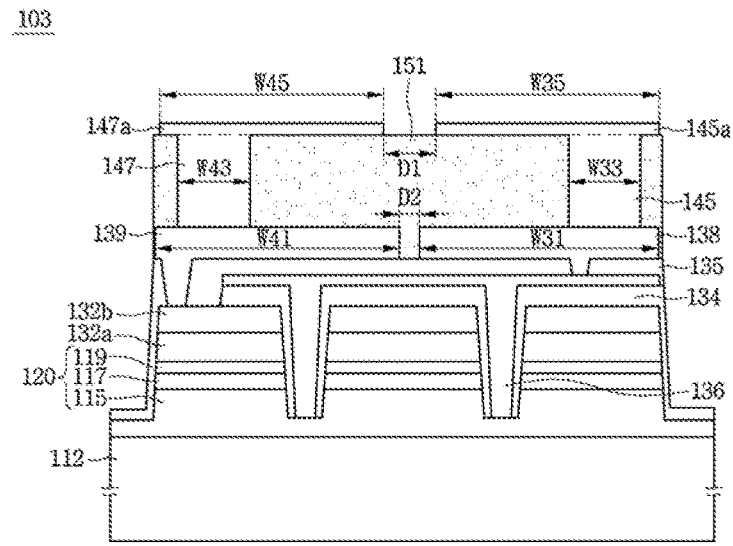

[FIG. 6]
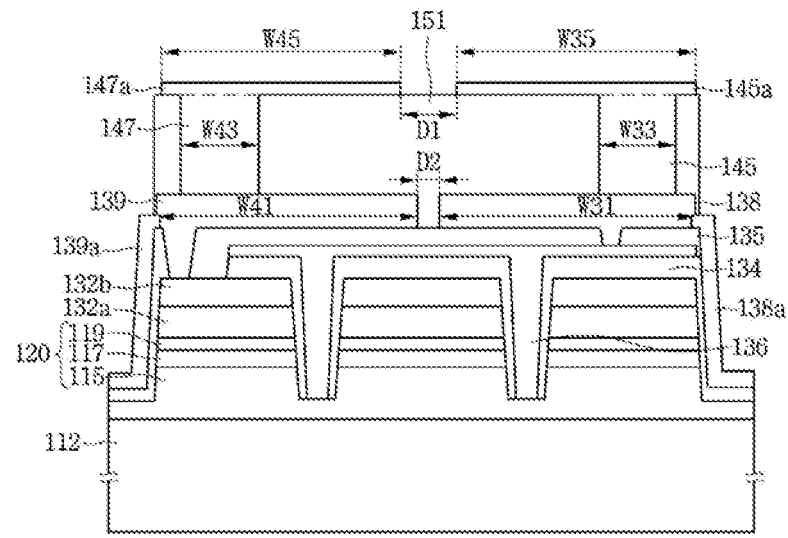
[FIG. 7]
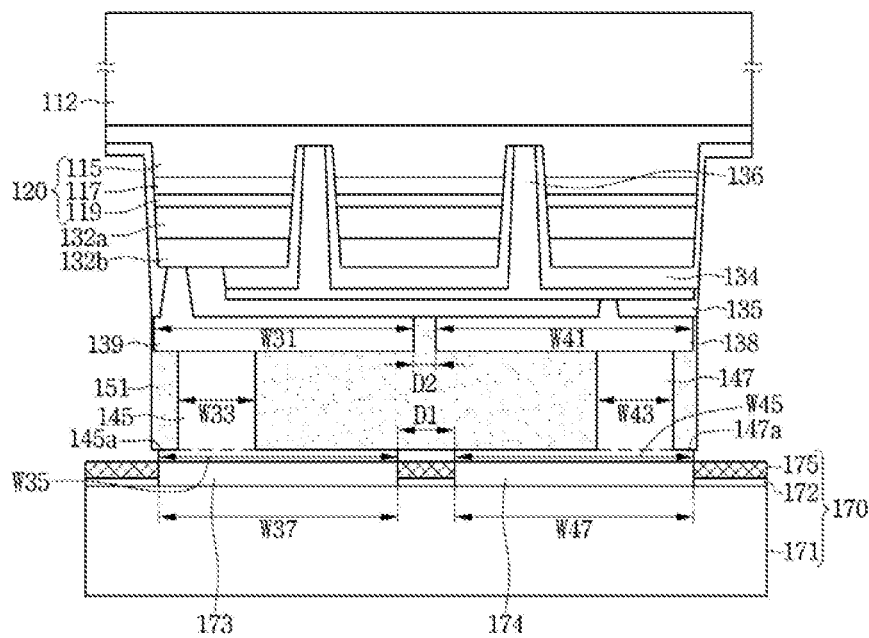

[FIG. 8]
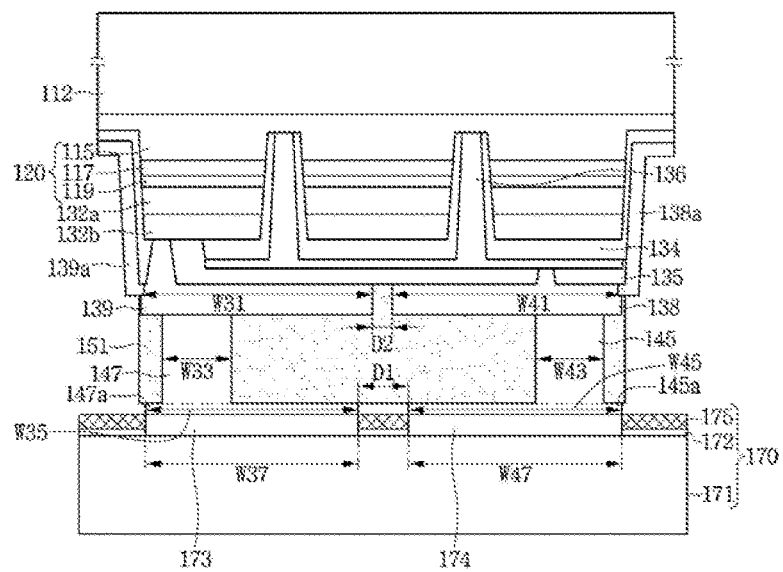
[FIG. 9]
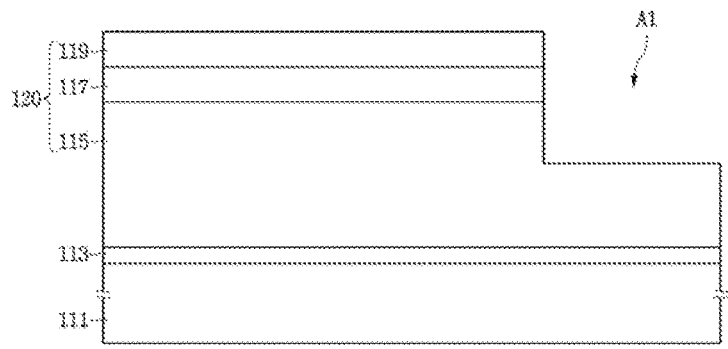
[FIG. 10]
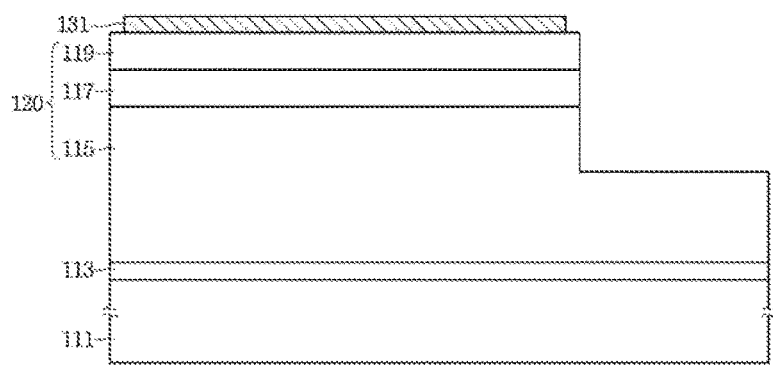

【FIG. 11】
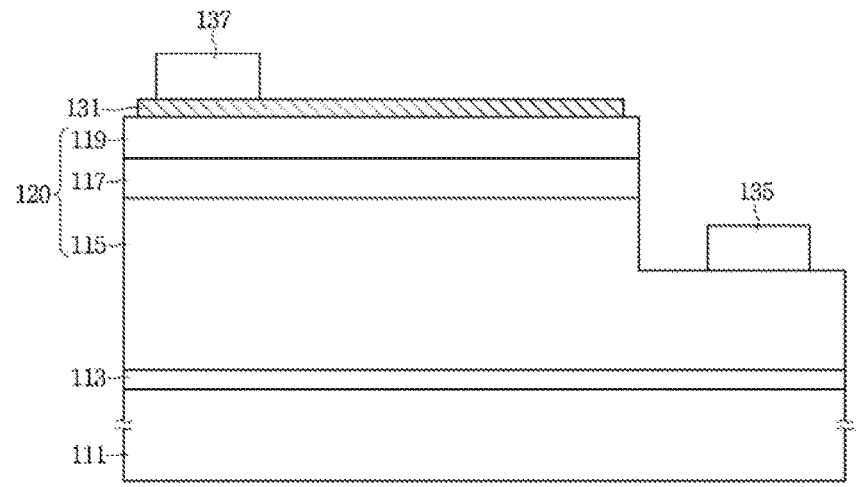
【FIG. 12】
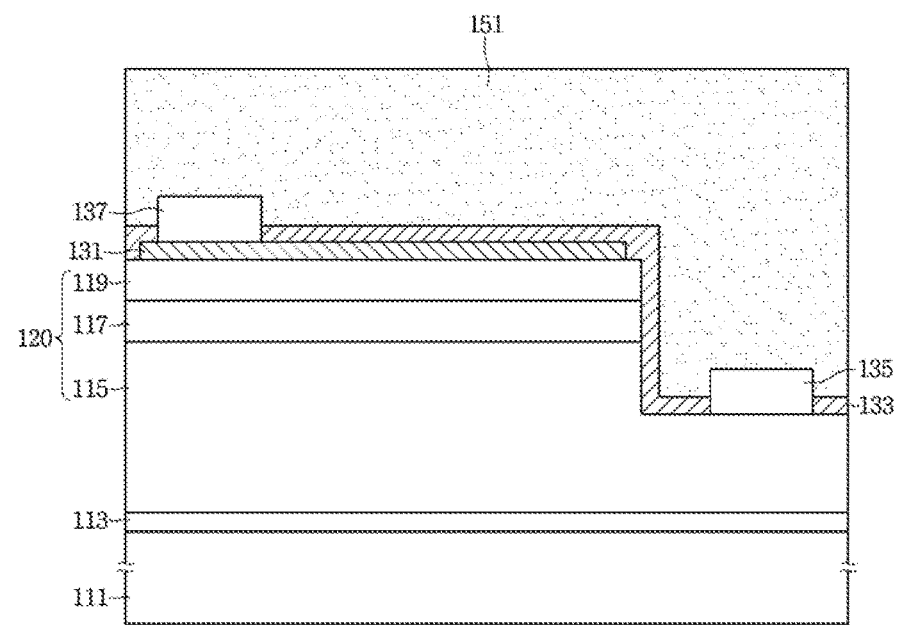

[FIG. 13]
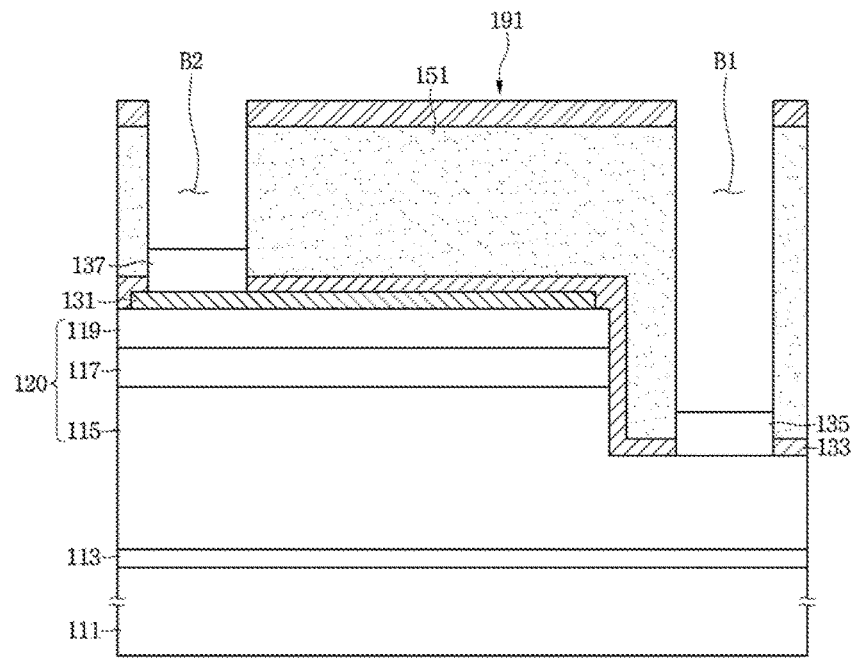
[FIG. 14]
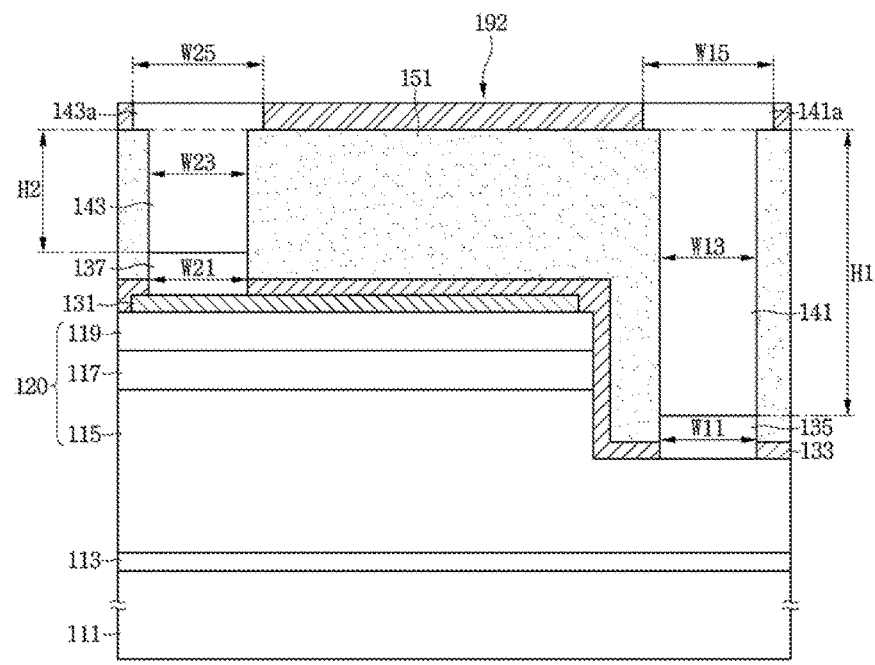

[FIG. 15]
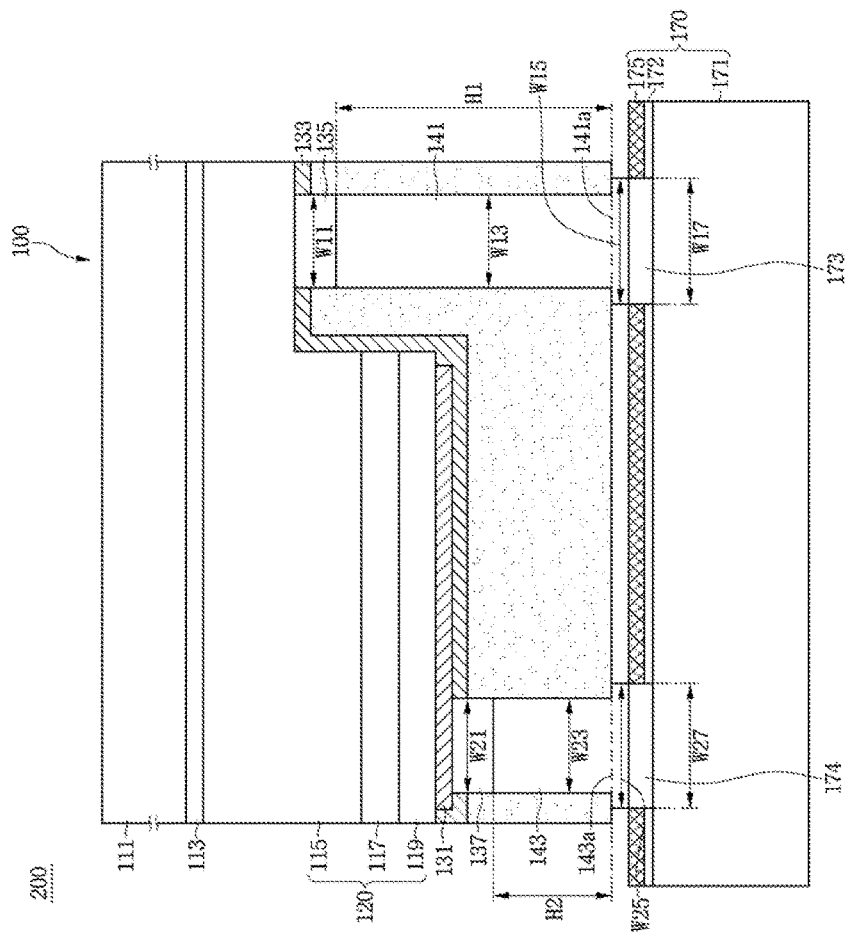

[FIG. 16]
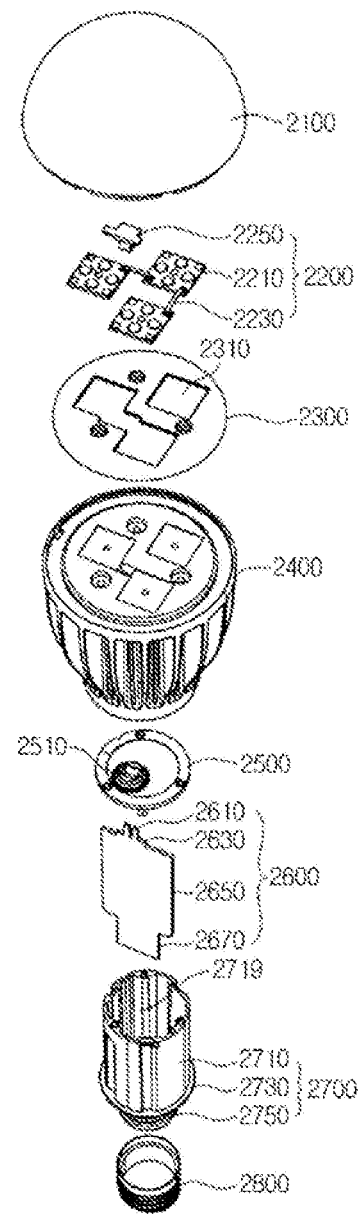

LIGHT EMITTING DEVICE, LIGHT EMITTING DEVICE PACKAGE, LIGHT UNIT, AND METHOD OF MANUFACTURING SAME

CROSS REFERENCE TO RELATED APPLICATIONS

This application is the National Phase of PCT International Application No. PCT/KR2015/014276, filed on Dec. 24, 2015, which claims priority under 35 U.S.C. 119(a) to Patent Application No. 10-2014-0187918, filed in the Republic of Korea on Dec. 24, 2014, all of which are hereby expressly incorporated by reference into the present application.

TECHNICAL FIELD

The embodiment relates to a light emitting device, a light emitting device package, a light unit, and a method of fabricating the same.

BACKGROUND ART

A light emitting device includes a P-N junction diode having a characteristic of converting electrical energy into light energy. The light emitting device may be fabricated with the compound of group III-V and group II-VI elements on the Periodic Table. The LED can produce various colors by adjusting the compositional ratio of the compound semiconductors.

For example, a nitride semiconductor represents higher thermal stability and wide bandgap energy so that the nitride semiconductor has been spotlighted in the field of optical devices and high-power electronic devices. For example, blue light emitting devices, green light emitting devices, ultraviolet (UV) light emitting devices, red light emitting devices or the like using nitride semiconductors are commercialized and widely used.

Meanwhile, recently, in a semiconductor industrial field, as the size of various electronic products is reduced, various studies and researches have been carried on to mount more many semiconductor chips on a substrate having a defined size by fabricating a small and high-integrated semiconductor package.

In the field of a light emitting device which is a semiconductor device, a flip-chip mounting technology is applied as a light emitting device mounting technology according to high integration trends.

The flip-chip mounting technology of the light emitting device is a technology of directly mounting a light emitting chip on a package substrate using a solder bump formed of a conductive material.

For example, according to the related art, in a flip-chip mounting structure, solder bumps are formed on a predetermined package substrate, metallic bumps are formed on the light emitting device chip corresponding to the solder bumps, respectively, thereby bonding the solder bumps with the metallic bumps.

However, according to the related art, in the above-described flip-chip mounting structure, peeling may be caused on the interface between an electrode of a light emitting device chip and the metallic bump serving as a connection electrode for a flip-chip, thereby degrading electrical reliability.

In addition, according to the related art, the bonding area between the solder bump of the package substrate and the metallic bump of the light emitting device chip is not insufficiently ensured, so that the electrical characteristic may be degraded.

In addition, according to the related art, an additional contact electrode is formed on the metallic bump of the light emitting device chip through Ni/Au plating. Accordingly, the electrical reliability may be degraded due to the difference in a thermal expansion coefficient between the metallic bump and the contact electrode.

Further, according to the related art, the electrical characteristic of the light emitting device may be degraded due to heat emitted from the light emitting device chip.

In addition, according to the related art, light emitted from the light emitting device chip and reflected upward represents a low reflectance index, so that light extraction efficiency may be lowered.

DISCLOSURE

Technical Problem

The embodiment is to provide a light emitting device capable of representing excellent reliability, a method of fabricating the same, a light emitting device package, and a lighting system.

The embodiment is to provide a light emitting device capable of representing improved heat dissipation characteristic, a method of fabricating the same, a light emitting device package, and a lighting system.

The embodiment is to provide a light emitting device capable of representing improved light extraction efficiency, a method of fabricating the same, a light emitting device package, and a lighting system.

Technical Problem

According to the embodiment, a light emitting device may include a light emitting structure including a first conductive semiconductor layer, an active layer, a second conductive semiconductor layer, a first electrode electrically connected with the first conductive semiconductor layer, a second electrode electrically connected with the second conductive semiconductor layer, an insulating member provided on the light emitting structure while exposing the first electrode and the second electrode, a third electrode provided on the first electrode, and a fourth electrode provided on the second electrode. The third electrode includes a first part of the third electrode directly making contact with the first electrode and a second part of the third electrode, which is provided on the first part of the third electrode and has a horizontal width wider than the first part of the third electrode, and the fourth electrode includes a first part of the fourth electrode directly making contact with the second electrode and a second part of the fourth electrode, which is provided on the first part of the fourth electrode and has a horizontal width wider than the first part of the fourth electrode. The light extraction efficiency and the heat radiation characteristic may be improved, and the reliability may be improved.

According to the embodiment, a light emitting device package may include a package substrate, a first pad electrode and a second pad electrode provided on the package substrate, and a light emitting device according to any one of claims 1 to 11, which is provided on the package substrate and electrically connected with the first pad electrode and the second pad electrode.

According to the embodiment, a light unit may include a light emitting device.

According to the embodiment, a method of fabricating a light emitting device may include forming a light emitting structure including a first conductive semiconductor layer, an active layer, a second conductive semiconductor layer on a substrate, forming a recess by removing portions of the active layer and the second conductive semiconductor layer to expose an upper portion of the first conductive semiconductor layer, forming a first electrode electrically connected with the first conductive semiconductor layer and a second electrode electrically connected with the second conductive semiconductor layer, forming an insulating layer on the light emitting structure and forming an insulating member on the insulating layer, and the first and second electrodes, providing a first mask on the insulating member and exposing top surfaces of the first and second electrodes, and forming a third electrode including a first part of the third electrode, which is connected with the first electrode, and a second part of the third electrode, which has a horizontal width wider than the first part of the third electrode, on the first electrode exposed through a screen printing process, and a fourth electrode including a first part of the fourth electrode, which is connected with the second electrode and has a horizontal width wider than the first part of the fourth electrode, on the second electrode.

Advantageous Effects

The embodiment may provide a light emitting device capable of representing excellent reliability, a method of fabricating the same, a light emitting device package, and a lighting system.

The embodiment may provide a light emitting device capable of representing improved light extraction efficiency, a method of fabricating the same, a light emitting device package, and a lighting system.

The embodiment may provide a light emitting device capable of representing improved heat dissipation characteristic, a method of fabricating the same, a light emitting device package, and a lighting system.

DESCRIPTION OF DRAWINGS

FIG. 1 is a sectional view of a light emitting device according to a first embodiment.

FIG. 2 is a sectional view of a light emitting device according to a second embodiment.

FIG. 3 is a sectional view of a light emitting device package according to the first embodiment.

FIG. 4 is a sectional view of a light emitting device package according to the second embodiment.

FIG. 5 is a sectional view of a light emitting device according to a fourth embodiment.

FIG. 6 is a sectional view of a light emitting device according to a fourth embodiment.

FIG. 7 is a sectional view of a light emitting device package according to the third embodiment.

FIG. 8 is a sectional view of a light emitting device package according to the fourth embodiment.

FIGS. 9 to 15 are sectional views showing a method of fabricating a light emitting device and a light emitting device package, according to the embodiment.

FIG. 16 is a perspective view of a lighting device, according to the embodiment.

BEST MODE

[Mode for Invention]

In the description of the embodiment, it will be understood that, when a layer (or film), a region, a pattern or structures are referred to as being "on" or "under" a substrate, another layer (film), another region, another pad, or other patterns, each can be "directly" or "indirectly" on the other layer (or film), region, pad, or patterns, or one or more intervening layers may also be present. Such a position of each layer will be described with reference to the drawings.

(Embodiment)

FIG. 1 is a sectional view of a light emitting device 100 according to a first embodiment, and FIG. 3 is a sectional view of a light emitting device package 200 according to the first embodiment. First, the light emitting device according to the embodiment will be described with reference to FIG. 1.

According to the embodiment, the light emitting device 100 may include a light emitting structure 120 including a first conductive semiconductor layer 115, an active layer 117, and a second conductive semiconductor layer 119, a first electrode 135 electrically connected with the first conductive semiconductor layer 115, a second electrode 137 electrically connected with the second conductive semiconductor layer 119, an insulating member 151 provided on the light emitting structure 120 while exposing the first electrode 135 and the second electrode 137, third electrodes 141 and 141a on the first electrode 135, and fourth electrodes 143 and 143a on the second electrode 137.

In the flip-chip mounting structure according to the related art, the bonding area between a solder bump of a package substrate and a metallic bump of a light emitting device chip is not insufficiently ensured, so that the electrical characteristic may be degraded.

In order to solve the above problem, according to the embodiment, the third electrodes 141 and 141a may include a first part 141 of the third electrode directly making contact with the first electrode 135 and a second part 141a of the third electrode extending along at least one lateral side on the first part 141 of the third electrode. In addition, according to the embodiment, the fourth electrodes 143 and 143a may include a first part 143 of the fourth electrode directly making contact with the second electrode 137 and a second part 143a of the fourth electrode extending along at least one lateral side on the first part 143 of the fourth electrode. In more detail, the second part 141a of the third electrode may be provided on the first part 141 of the third electrode, and the second part 143a of the fourth electrode may be provided on the first part 143 of the fourth electrode. The second part 141a of the third electrode and the second part 143a of the fourth electrode have top surfaces exposed outward from the insulating member 151. Portions of the second part 141a of the third electrode and the second part 143a of the fourth electrode may extend upward from the insulating member 151. The portions of the second part 141a of the third electrode and the second part 143a of the fourth electrode may be provided on a top surface of the insulating member 151, but the embodiment is not limited thereto. For example, the second part 141a of the third electrode and the second part 143a of the fourth electrode have top surfaces exposed from the insulating member 151, and side portions of the second part 141a of the third electrode and the second part 143a of the fourth electrode may be received in the insulating member 151.

According to the embodiment, as shown in FIG. 3, the second part 141a of the third electrode or the second part 143a of the fourth electrode extend along at least one lateral side on the first part 141 of the third electrode or the first part 143 of the fourth electrode. Accordingly, the horizontal widths of the second part 141a of the third electrode or the second part 143 of the fourth electrode making contact with the first pad electrode 173 or the second pad electrode 174 are widely ensured in the subsequent packaging process, thereby increasing a coupling force. Accordingly, the physical reliability and the electrical reliability may be increased.

For example, as shown in FIG. 1, according to the embodiment, a horizontal width W15 of the second part 141a of the third electrode may be wider than a horizontal width W13 of the first part 141 of the third electrode. In addition, according to the embodiment, a horizontal width W25 of the second part 143a of the fourth electrode may be wider than a horizontal width W23 of the first part 143 of the fourth electrode.

According to the embodiment, the horizontal width W15 of the second part 141a of the third electrode or the horizontal width W25 of the second part 143a of the fourth electrode may be wider than the horizontal width W13 of the first part 141 of the third electrode or the horizontal width W23 of the second part 143 of the fourth electrode, respectively. Accordingly, the second part 141a of the third electrode or the second part 143a of the fourth electrode may make contact with the first pad electrode 173 or the second pad electrode 174 with a wider contact area. Accordingly, the physical reliability and the electrical reliability may be increased.

For example, the horizontal width W15 of the second part 141a of the third electrode or the horizontal width W25 of the second part 143a of the fourth electrode is about 1.1 times or more wider than of the horizontal width W13 of the first part 141 of the third electrode or the horizontal width W23 of the first part 143 of the fourth electrode, thereby ensuring a wider contact area. Accordingly, the physical reliability and the electrical reliability may be increased. As the width is formed to more than one time to ensure a wider contact area, the physical reliability and the electrical reliability may be increased.

The horizontal width W15 of the second part 141a of the third electrode or the horizontal width W25 of the second part 143a of the fourth electrode may be widely formed to the extent of preventing the electrical short between the third electrode and the fourth electrode.

For example, the horizontal width W15 of the second part 141a of the third electrode or the horizontal width W25 of the second part 143a of the fourth electrode is about 1.2 times to 3.0 times wider than of the horizontal width W13 of the first part 141 of the third electrode or the horizontal width W23 of the first part 143 of the fourth electrode, but the embodiment is not limited thereto.

For example, the horizontal width W15 of the second part 141a of the third electrode or the horizontal width W25 of the second part 143a of the fourth electrode is 1.2 times to 1.4 times wider than of the horizontal width W13 of the first part 141 of the third electrode or the horizontal width W23 of the first part 143 of the fourth electrode, but the embodiment is not limited thereto.

For example, when the horizontal width W13 of the first part 141 of the third electrode or the horizontal width W23 of the first part 143 of the fourth electrode is in the range of about 50 μm to 500 μm, the horizontal width W15 of the second part 141a of the third electrode or the horizontal width W25 of the second part 143a of the third electrode may be in the range of about 70 μm to about 600 μm, but the embodiment is not limited thereto.

In addition, according to the embodiment, the horizontal width W15 of the second part 141a of the third electrode or the horizontal width W25 of the second part 143a of the fourth electrode is wider than of the horizontal width W11 of the first electrode 135 or the horizontal width W21 of the second electrode 137, thereby improving electrical performance.

In addition, according to the related art, an additional contact electrode is formed on the metallic bump of the light emitting device chip through Ni/Au plating. Accordingly, the electrical reliability may be degraded due to the difference in a thermal expansion coefficient between the metallic bump and the contact electrode.

In order to solve the problem, according to the embodiment, the second part 141a of the third electrode or the second part 143a of the fourth electrode may be formed of a material the same as that of the first part 141 of the third electrode or the first part 143 of the fourth electrode. Accordingly, even if the temperature of the light emitting device or the lighting device package is increased, the second part 141a of the third electrode or the second part 143a of the fourth electrode have the same thermal expansion coefficients as those of the first part 141 of the third electrode or the first part 143 of the fourth electrode. Accordingly, the electrical reliability may be increased.

However, according to the related art, in the flip-chip mounting structure, peeling may be caused on the interface between an electrode of a light emitting device chip and the metallic bump, thereby degrading electrical reliability.

Accordingly, according to the embodiment, the second part 141a of the third electrode or the second part 143a of the fourth electrode is formed in contact with the top surface of the insulating member 151 to increase the rigidity of the physical structure. Therefore, the physical coupling and the electrical reliability may be improved between the first electrode 135 and the third electrodes 141 and 141a and between the second electrode 137 and the fourth electrodes 143 and 143a.

The insulating member 151 may include a photoresist material, resin, or epoxy.

For example, when the insulating member 151 is formed of the photoresist material, the insulating member 151 may include polyimide, but the embodiment is not limited thereto.

In addition, the insulating member 151 may be formed by adding a thermal spreader into resin such as silicone or epoxy. The thermal spreader may include at least one material of an oxide, a nitride, a fluoride, and a sulfide having a material, such as Al, Cr, Si, Ti, Zn, or Z. For example, the thermal spreader may include a ceramic material. The thermal spreader may include a powder particle, a grain, a filler, or an additive having a predetermined size.

Meanwhile, components having reference numerals, which are not described, among components shown in FIGS. 1 and 3 will be described in the following description of a fabricating method.

FIG. 2 is a sectional view of a light emitting device 100 according to a second embodiment, and FIG. 4 is a sectional view of a light emitting device package 202 according to the second embodiment.

The second embodiment may employ a technical feature of the first embodiment. The following description will be described while focusing on the technical feature of the second embodiment.

In addition, according to the related art, light emitted from the light emitting device chip and reflected upward represents a low reflectance index, so that light extraction efficiency may be lowered. In addition, the electrical characteristic of the light emitting device may be degraded due to heat emitted from the light emitting chip.

Therefore, the second embodiment may include a first side electrode 135a extending along at least one lateral side of the first electrode 135. For example, the first side electrode 135a interposes an insulating layer 133 between the first side electrode 135a and the first electrode 135 and transversely extends along a top surface of the first conductive semiconductor layer 115.

Therefore, the second embodiment may include the first side electrode 135a extending along at least one lateral side of the first electrode 135. Therefore, the second embodiment may include the first side electrode 135a extending along both lateral sides of the first electrode 135.

Therefore, the second embodiment may include a second side electrode 137a extending along at least one lateral side of a second electrode 137. For example, the second side electrode 137a interposes the insulating layer 133 between the second side electrode 137a and the second electrode 137 and transversely extends along a top surface of the second conductive semiconductor layer 119.

Therefore, the second embodiment may include a second side electrode 137a extending along one lateral side of the second electrode 137. Therefore, the second embodiment may include the second side electrode 137a extending along at least both sides of the second electrode 137.

According to the second embodiment, a passivation layer serving as an insulating layer is formed on a lateral side of the light emitting structure 120, the first side electrode 135a, and the second side electrode 137a, thereby preventing electrical short.

According to the second embodiment, the first side electrode 135a or the second side electrode 137a extending along at least one lateral side of the first electrode 135 or the second electrode 137 is included, thereby reflecting light emitted from the light emitting device upward the light emitting device package by the first side electrode 135a or the second side electrode 137a to improve light extraction efficiency so that the light efficiency is improved.

According to the second embodiment, the first side electrode 135a or the second side electrode 137a extending along at least one lateral side of the first electrode 135 or the second electrode 137 is included, thereby effectively radiating heat emitted from the light emitting device to the first electrode 135 or the second electrode 137 by the first side electrode 135a or the second side electrode 137a to significantly improve a heat radiation characteristic.

In addition, as shown in FIG. 4, according to the second embodiment, a light extraction pattern P is provided on a first substrate 111 to improve light extraction efficiency.

In addition, according to the second embodiment, the light extraction pattern may be formed on the first conductive semiconductor layer 115 exposed after the first substrate 111 is removed, but the embodiment is not limited thereto.

The embodiment may provide a light emitting device capable of representing excellent reliability, and a light emitting device package.

The embodiment may provide a light emitting device capable of representing improved light extraction efficiency and an improved heat radiation characteristic, and light emitting device package.

Hereinafter, a light emitting device and a light emitting device package according to the third embodiment and the fourth embodiment will be described with reference to FIGS. 5 to 8.

FIG. 5 is a sectional view of a light emitting device 103 according to a third embodiment, and FIG. 7 is a sectional view of a light emitting device package 203 according to the third embodiment.

The third embodiment may employ a technical feature of the first embodiment or the second embodiment. The following description will be described while focusing on the technical feature of the third embodiment.

According to the third embodiment, a light emitting device 103 may include a light emitting structure 120 including a first conductive semiconductor layer 115, an active layer 117, and a second conductive semiconductor layer 119, a though electrode 136 formed through portions of the second conductive semiconductor layer 119 and the active layer 117 and electrically connected with the though electrode 136, a second electrode 139 electrically connected with the second conductive semiconductor layer 119, and an insulating member 151 provided on the light emitting structure 120 while exposing the first electrode 138 and the second electrode 139.

According to the third embodiment, the light emitting structure 120 may be formed on the second substrate 112. The second substrate 112 may be formed of a material having excellent thermal conductivity, and may be a conductive substrate or an insulating substrate. For example, the second substrate 112 may employ at least one of sapphire ($Al_2O_3$), SiC, Si, GaAs, GaN, ZnO, GaP, InP, Ge, or $Ga_2O_3$.

The third embodiment may include an ohmic layer 132a and a reflective layer 132b on the second conductive semiconductor layer 119. The ohmic layer 132a may be formed of single metal or may be formed by laminating a metallic alloy and a metallic oxide to a multiple layer.

For example, the ohmic layer 132a may be formed of a material representing excellent electrical contact with a semiconductor. For example, the ohmic layer 132a may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

In addition, the reflective layer 132b may represent excellent reflectance and may be formed of a material representing excellent electrical contact. For example, the reflective layer 132b may be formed of metal including at least one of Ag, Ni, Al, Rh, Pd, Ir, Ru, Mg, Zn, Pt, Au, and Hf or the alloy thereof.

The through electrode 136 may be formed on the light emitting structure 120 while interposing the first insulating layer 134 between the through electrodes 136 and the light emitting structure 120. The first insulating layer 134 or the second insulating layer 135 may be formed of an insulating material such as an oxide or a nitride, but the embodiment is not limited thereto.

The first electrode 138 and the second electrode 139 may be electrically connected with the exposed though electrode 136 and the reflective layer 132b.

The insulating member 151 may include a photoresist material, resin, or epoxy.

For example, when the insulating member 151 is formed of the photoresist material, the insulating member 151 may include polyimide, but the embodiment is not limited thereto.

In addition, the insulating member 151 may be formed by adding a thermal spreader into resin such as silicone or epoxy. The thermal spreader may include at least one material of an oxide, a nitride, a fluoride, and a sulfide having a material, such as Al, Cr, Si, Ti, Zn, or Z. For example, the thermal spreader may include a ceramic material. The thermal spreader may include a powder particle, a grain, a filler, or an additive having a predetermined size.

The third embodiment may include third electrodes 145 and 145a provided on the first electrode 138. The third electrodes 145 and 141a may include a first part 145 of the third electrode directly making contact with the first electrode 138 and a second part 145a of the third electrode on the first part 145. The second part 145a of the third electrode may extend along at least one lateral side of the first part 145 of the third electrode on the first part 145 of the third electrode. Therefore, the third embodiment may include the second part 145a of the third electrode extending along at least one lateral side of the first part 145 of the third electrode on the first part 145 of the third electrode. Therefore, the third embodiment may include the second part 145a of the third electrode extending along at least both lateral sides of the first part 145 of the third electrode on the first part 145 of the third electrode.

The third embodiment may include fourth electrodes 147 and 145a provided on the second electrode 139. The fourth electrodes 147 and 147a may include a first part 147 of the fourth electrode directly making contact with the second electrode 139 and a second part 147a of the fourth electrode on the first part 147 of the fourth electrode. The second part 147a of the fourth electrode may extend along at least one lateral side of the first part 147 of the fourth electrode on the first part 147 of the fourth electrode. Therefore, the third embodiment may include the second part 147a of the fourth electrode extending along at least one lateral side of the first part 147 of the fourth electrode on the first part 147 of the fourth electrode. Therefore, the third embodiment may include the second part 147a of the fourth electrode extending along at least both lateral sides of the first part 147 of the fourth electrode on the first part 147 of the fourth electrode. In more detail, the second part 141a of the third electrode may be provided on the first part 145 of the third electrode, and the second part 147a of the fourth electrode may be provided on the first part 147 of the fourth electrode. The second part 145a of the third electrode and the second part 147a of the fourth electrode may have top surfaces exposed outward from the insulating member 151. Portions of the second part 145a of the third electrode and the second part 147a of the fourth electrode may extend upward from the insulating member 151. The portions of the second part 145a of the third electrode and the second part 147a of the fourth electrode may be provided on a top surface of the insulating member 151, but the embodiment is not limited thereto. For example, the second part 145a of the third electrode and the second part 147a of the fourth electrode have top surfaces exposed from the insulating member 151, and side portions of the second part 145a of the third electrode and the second part 147a of the fourth electrode may be received in the insulating member 151.

The third embodiment includes the second part 145a of the third electrode or the second part 145a of the fourth electrode extending along at least one lateral side on the first part 145 of the third electrode or the first part 147 of the fourth electrode. Accordingly, as shown in FIG. 7, the horizontal widths of the second part 145a of the third electrode or the second part 147a of the fourth electrode making contact with the third pad electrode 173 or the fourth pad electrode 174 are widely ensured in the subsequent packaging process, thereby increasing a coupling force. Accordingly, the physical reliability and the electrical reliability may be increased.

For example, as shown in FIG. 7, according to the embodiment, the horizontal width W35 of the second part 145a of the third electrode or the horizontal width W45 of the second part 147a of the fourth electrode may be wider than the horizontal width W33 of the first part 145 of the third electrode or the horizontal width W43 of the first part 147 of the third electrode, respectively. Accordingly, the second part 141a of the third electrode or the second part 143a of the fourth electrode may make contact with the first pad electrode 173 or the second pad electrode 174 with a wider contact area. Accordingly, the physical reliability and the electrical reliability may be increased.

For example, the horizontal width W35 of the second part 145a of the third electrode or the horizontal width W45 of the second part 147a of the fourth electrode is at least 1.1 times wider than of the horizontal width W33 of the first part 145 of the third electrode or the horizontal width W43 of the first part 147 of the fourth electrode, thereby ensuring a wide contact area. Accordingly, the physical reliability and the electrical reliability may be increased.

The horizontal width W35 of the second part 145a of the third electrode or the horizontal width W45 of the second part 147a of the fourth electrode may be widely formed to the extent of preventing the electrical short between the third electrode and the fourth electrode.

For example, the horizontal width W35 of the second part 145a of the third electrode or the horizontal width W45 of the second part 147a of the fourth electrode is about 1.2 times to 3.0 times wider than of the horizontal width W33 of the first part 145 of the third electrode or the horizontal width W43 of the first part 147 of the third electrode, but the embodiment is not limited thereto.

For example, the horizontal width W35 of the second part 145a of the third electrode or the horizontal width W45 of the second part 147a of the fourth electrode is about 1.2 times to 1.4 times wider than of the horizontal width W33 of the first part 145 of the third electrode or the horizontal width W43 of the first part 147 of the fourth electrode, but the embodiment is not limited thereto.

For example, when the horizontal width W33 of the first part 145 of the third electrode or the horizontal width W43 of the first part 147 of the fourth electrode is in the range of about 50 μm to 500 μm, the horizontal width W35 of the second part 145a of the third electrode or the horizontal width W45 of the second part 147a of the fourth electrode may be in the range of about 70 μm to 600 μm, but the embodiment is not limited thereto.

In addition, according to the third embodiment, the horizontal width W31 of the first electrode 138 or the horizontal width W41 of the second electrode 139 is wider than the horizontal width W35 of the second part 145a of the third electrode or the horizontal width W45 of the second part 147a of the fourth electrode, thereby improving heat radiation efficiency. In addition, the reflectance of the emitted light is increased, thereby improving light extraction efficiency.

In addition, according to the embodiment, the second distance D2 between the first electrode 138 and the second electrode 139 is narrower than the distance D1 between the second part 145a of the third electrode and the second part 147a of the fourth electrode, thereby maximizing the horizontal width W31 of the first electrode 138 or the horizontal width W41 of the second electrode 139 to increase reflectance. Accordingly, optical power may be improved and heat radiation efficiency may be improved, thereby improving reliability.

According to the third embodiment, the second part 145a of the third electrode or the second part 147a of the fourth electrode may be formed of a material the same as that of the first part 145 of the third electrode or the first part 147 of the fourth electrode. Accordingly, even if the temperature of the light emitting device or the lighting device package is increased, the second part 145a of the third electrode or the second part 147a of the fourth electrode have the same thermal expansion coefficients as those of the first part 145 of the third electrode or the first part 147 of the fourth electrode. Accordingly, the electrical reliability may be increased.

According to the third embodiment, the second part 145a of the third electrode or the second part 147a of the fourth electrode is formed in contact with the top surface of the insulating member 151 to increase the rigidity of the physical structure. Therefore, the physical coupling and the electrical reliability may be improved between the first electrode 138 and the second electrode 139, and between the first part 145 of the third electrode and the first part 147 of the fourth electrode.

FIG. 6 is a sectional view of a light emitting device 104 according to a fourth embodiment, and FIG. 8 is a sectional view of a light emitting device package 204 according to the fourth embodiment.

The fourth embodiment may employ a technical feature of the third embodiment. The following description will be described while focusing on the technical feature of the third embodiment.

In addition, according to the related art, light emitted from the light emitting device chip and reflected upward represents a low reflectance index, so that light extraction efficiency may be lowered. In addition, the electrical characteristic of the light emitting device may be degraded due to heat emitted from the light emitting chip.

Therefore, the fourth embodiment may include a first side electrode 138a extending along at least one lateral side of the first electrode 138. For example, the third side electrode 138a may is formed on a mesa-edge region formed by removing a portion of the light emitting structure 120 while extending downward. For example, the third side electrode 138a may extend downward along the lateral side of the light emitting structure 120 while interposing a first insulating layer 134 between the third side electrode 138a and the light emitting structure 120. The bottom surface of the third side electrode 138a may be located lower than the active layer 117.

Therefore, the fourth embodiment may include a fourth side electrode 139a extending along at least one lateral side of the second electrode 139. For example, the fourth side electrode 139a may is formed on a mesa-edge region formed by removing a portion of an opposite side of the light emitting structure 120 while extending downward. For example, the fourth side electrode 139a may extend downward along the lateral side of the light emitting structure 120 while interposing the first insulating layer 134 between the fourth side electrode 139a and the light emitting structure 120. The bottom surface of the fourth side electrode 139a may be located lower than the active layer 117.

According to the fourth embodiment, the third side electrode 138a or the fourth side electrode 139a extending along at least one lateral side of the first electrode 138 or the second electrode 137 is included, thereby reflecting light emitted from the light emitting device upward the light emitting device package by the third side electrode 138a or the fourth side electrode 139a to improve light extraction efficiency so that the light efficiency is improved.

According to the fourth embodiment, the third side electrode 138a or the fourth side electrode 139a extending along at least one lateral side of the first electrode 138 or the second electrode 139 is included, thereby effectively radiating heat emitted from the light emitting device to the first electrode 138 or the second electrode 139 by the third side electrode 138a or the fourth side electrode 139a to significantly improve a heat radiation characteristic.

FIGS. 7 and 8 show light emitting device packages 203 and 204 according to a third or fourth embodiment.

According to the third or fourth embodiment, the light emitting device 103 or 104 may be mounted on a module substrate 170 in a flip-chip scheme, but the embodiment is not limited thereto.

For example, the light emitting device package 203 or 204 according to the third or fourth embodiment may include a package substrate 171, a first pad electrode 173 and a second pad electrode 174 provided on the package substrate 171, and the light emitting device 103 or 104 according to the third or fourth embodiment electrically connected with the first pad electrode 173 or the second pad electrode 174.

The module substrate 170 may be a printed circuit board (PCB) including a circuit pattern (not shown). In this case, the module substrate 170 may include resin-based PCB, a metal core PCB (MCPCB) or a flexible PCB (FPCB), but the embodiment is not limited thereto.

According to the embodiment, the module substrate 170 may include the package substrate 171 and the insulating layer 172 and may include a first pad electrode 171 and a second pad electrode 174 formed through the insulating layer 172. The first pad electrode 173 and the second pad electrode 174 supply power to the third or fourth light emitting device 103 or 104.

A protective layer 175 is formed on an area of the insulating layer 172 except for the first pad electrode 173 and the second pad electrode 174. The protective layer 175 may serve as a solder resist layer and may include a white or green protective layer.

The protective layer 175 may efficiently reflect light to increase an amount of reflected light.

According to the embodiment, a horizontal width W37 of the first pad electrode is wider than a horizontal width W33 of the first part, thereby increasing the contact area between the first pad electrode 173 and the second part 145a, so that the physical reliability and the electrical reliability may be increased.

According to the embodiment, the horizontal width W47 of the second pad electrode is wider than the horizontal width W43 of the first part, thereby increasing the contact area between the second pad electrode 174 and the second part 147a, so that the physical reliability and the electrical reliability may be increased.

Hereinafter, a light emitting device and a method of fabricating a light emitting device package according to the embodiment will be described with reference to FIGS. 9 to 15. Meanwhile, FIGS. 9 to 15 are illustrated based on the first embodiment, but the embodiment is not limited thereto.

First, as illustrated in FIG. 9, the first substrate 111 is prepared. The first substrate 111 may be formed of a material having excellent thermal conductivity, and may be a conductive substrate or an insulating substrate.

For example, the first substrate 111 may employ at least one of sapphire ($Al_2O_3$), SiC, Si, GaAs, GaN, ZnO, GaP, InP, Ge, or $Ga_2O_3$. A concavo-convex structure may be formed on the first substrate 111, but the embodiment is not limited thereto. Wet cleaning may be performed with respect to the first substrate 111 to remove foreign matters from the surface of the first substrate 111.

Thereafter, the light emitting structure 120 including the first conductive semiconductor layer 115, the active layer 117, and the second conductive semiconductor layer 119 may be formed on the first substrate 111.

Meanwhile, a buffer layer 113 may be formed on the first substrate 111. The buffer layer 113 may reduce the lattice mismatch between the material of the light emitting structure 120 and the first substrate 111.

For example, the buffer layer 113 may be formed at least one of group III-V compound semiconductors, such as GaN, InN, AlN, InGaN, AlGaN, InAlGaN, and AlInN. An undoped semiconductor layer may be formed on the buffer layer 113, but the embodiment is not limited thereto The first conductive semiconductor layer 115 may be realized with semiconductor compounds, for example, compound semiconductors of groups III-V and II-VI, and may be doped with first conductive dopants.

When the first conductive semiconductor layer 115 is an N type semiconductor layer, the first conductive dopant may include Si, Ge, Sn, Se, or Te serving as an N type dopant, but the embodiment is not limited thereto.

The first conductive semiconductor layer 115 may include a semiconductor material having a composition formula of $In_xAl_yGa_{1-x-y}N$ ($0 \leq x \leq 1$, $0 \leq y \leq 1$, $0 \leq x+y \leq 1$). For example, the first conductive semiconductor layer 115 may be formed of any one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 115 may include an N type GaN layer formed through Chemical Vapor Deposition (CVD), Molecular Beam Epitaxy (MBE), sputtering, or Hydride Vapor Phase Epitaxy (HVPE). In addition, the first conductive semiconductor layer 115 may be formed by introducing trimethyl gallium gas (TMGa), ammonia gas (NH3), nitrogen gas (N2), and silane gas (SiH4) including N type dopants such as silicon (Si) into a chamber.

Next, a current spreading layer (not shown) may be formed on the first conductive semiconductor layer 115. The current spreading layer may serve as an undoped GaN layer, but the embodiment is not limited thereto.

In addition, according to the embodiment, a strain control layer (not shown) may be formed on the current spreading layer. For example, the strain control layer may be formed of $In_yAl_xGa_{(1-x-y)}N$ ($0 \leq x \leq 1$, $0 \leq y \leq 1$)/GaN, and thus may effectively reduce stress caused by the lattice mismatch between the first conductive semiconductor layer 115 and the active layer 117.

According to the embodiment, the active layer 117 is a layer to emit light having energy determined by an intrinsic energy band of an active layer (light emitting layer) material as electrons injected through the first conductive semiconductor layer 115 are combined with holes injected through the second conductive semiconductor layer 116.

The active layer 117 may be formed in at least one of a single quantum well structure, a multi-quantum well (MQW) structure, a quantum wire structure and a quantum dot structure.

For example, the active layer 117 may be formed in the MQW structure by injecting TMGa gas, $NH_3$ gas, $N_2$ gas, and trimethyl indium (TMIn) gas, but the embodiment is not limited thereto.

The active layer 117 may include a well layer/barrier layer structure. For example, the active layer 117 may be formed in at least one of pair structures of InGaN/GaN, InGaN/InGaN, GaN/AlGaN, InAlGaN/GaN, GaAs/AlGaAs, InGaAs/AlGaAs, GaP/AlGaP, and InGaP/AlGaP, but the embodiment is not limited thereto. The well layer may be formed of a material having a bandgap lower than that of the barrier layer.

According to the embodiment, an electron blocking layer (not shown) may be formed on the active layer 117. The electron blocking layer may perform the function of electron blocking and MQW cladding of the active layer, thereby improving light emitting efficiency. For example, the electron blocking layer may be formed of a semiconductor based on $Al_xIn_yGa_{(1-x-y)}N$ ($0 \leq x \leq 1$, $0 \leq y \leq 1$) and may have energy bandgap higher than that of the active layer 117.

In addition, the electronic blocking layer may be formed of $Al_zGa_{(1-z)}N/GaN$ ($0 \leq z \leq 1$) superlattice, but the embodiment is not limited thereto. The electron blocking layer may effectively block electrons overflown after being implanted with P type ions and may increase the injection efficiency of holes.

The second conductive semiconductor layer 119 may be realized with semiconductor compounds, for example, compound semiconductors of groups III-V and II-VI, and may be doped with second conductive dopants.

For example, the second conductive semiconductor layer 119 may include a semiconductor material having a composition formula of $In_xAl_yGa_{1-x-y}N$ ($0 \leq x \leq 1$, $0 \leq y \leq 1$, $0 \leq x+y \leq 1$). When the second conductive semiconductor layer 119 is a P type semiconductor layer, the second conductive dopant may include Mg, Zn, Ca, Sr, or Ba serving as a P type dopant.

The second conductive semiconductor layer 119 may be a P-type GaN layer, which is formed by injecting trimethyl gallium (TMGa) gas, ammonia ($NH_3$) gas, nitrogen (N2) gas, and biscetyl cyclo pentadienyl magnesium (($EtCp_2Mg$) $\{Mg(C_2H_5C_5H_4)_2\}$) including a P-type impurity such as Mg into a chamber, but the embodiment is not limited thereto.

According to the embodiment, the first conductive semiconductor layer 115 may be realized with an N-type semiconductor layer and the second conductive type semiconductor layer 112 may be realized with a P-type semiconductor layer, but the embodiment is not limited thereto.

Alternatively, a semiconductor layer having an opposite conductive type to the second conductive type, for example, an N-type semiconductor layer (not shown) may be formed over the second conductive semiconductor layer 119.

Accordingly, the light emitting structure 120 may be implemented in at least one of an N-P junction structure, a P-N junction structure, an N-P-N junction structure, and a P-N-P junction structure Next, as shown in FIG. 9, a recess A1 may be formed by removing portions of the second conductive semiconductor layer 119, the electron blocking layer, and the active layer 117 to expose a top surface of the first conductive semiconductor layer 115. In this case, a portion of the top surface of the first conductive semiconductor layer 115 may be removed, but the embodiment is not limited thereto.

Next, as shown in FIG. 10, an electrode layer 131 may be formed on the second conductive semiconductor layer 119.

For example, the electrode layer 131 may include an ohmic layer. The electrode layer 131 may be formed of single metal or may be formed by laminating a metallic alloy and a metallic oxide to a multiple layer.

For example, the electrode layer 131 may be formed of a material representing excellent electrical contact with a semiconductor. For example, the electrode layer 131 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, 및 Ni/IrOx/Au/ITO, Ag, Ni, Cr, Ti, Al, Rh, Pd, Ir, Ru, Mg, Zn, Pt, Au, and Hf, but the embodiment is not limited thereto.

Next, as shown in FIG. 11, a second electrode 137 and a first electrode 135 may be formed on the electrode layer 131 and the first conductive semiconductor layer 115.

The first electrode 135 and the second electrode 137 may be formed of at least one of titanium (Ti), chromium (Cr), nickel (Ni), aluminum (Al), platinum (Pt), gold (Au), tungsten (W), and molybdenum (Mo), but the embodiment is not limited thereto.

Next, as shown in FIG. 12, an insulating layer 133 may be formed on the electrode layer 131. The insulating layer 133 may be formed through a sputtering scheme or a deposition scheme. The insulating layer 133 may be formed on an area except for the first electrode 135 and the second electrode 137 to cover top surfaces of the electrode layer 131 and the second conductive semiconductor layer 119 and an exposed area of the first conductive semiconductor layer 115.

The insulating layer 133 may include an insulating material, such as an oxide, a nitride, a fluoride, and a sulfide having a material including Al, Cr, Si, Ti, Zn, or Z, or insulating resin. For example, the insulating layer 133 may be formed of one selected from the group consisting of $SiO_2$, $Si_3N_4$, $Al_2O_3$, and $TiO_2$. The insulating layer 133 may be formed in a single layer or a multi-layer, but the embodiment is not limited thereto.

Next, the insulating member 151 may be formed on the first electrode 135, the second electrode 137, and the insulating layer 133.

The insulating member 151 may include a photoresist material, resin, or epoxy. For example, when the insulating member 151 is formed of the photoresist material, the insulating member 151 may include polyimide, but the embodiment is not limited thereto.

In addition, the insulating member 151 may be formed by adding a thermal spreader into resin such as silicone or epoxy. The thermal spreader may include at least one material of an oxide, a nitride, a fluoride, and a sulfide having a material, such as Al, Cr, Si, Ti, Zn, or Z. For example, the thermal spreader may include a ceramic material. The thermal spreader may include a powder particle, a grain, a filler, or an additive having a predetermined size.

The thermal spreader may include a ceramic material. The ceramic material may include low temperature co-fired ceramic (LTCC) or high temperature co-fired ceramic (HTCC).

The ceramic material may be formed of a metallic nitride having thermal conductivity higher than that of a nitride or an oxide among insulating materials such as the nitride or the oxide. The metallic nitride may include a material having the thermal conductivity of 140 W/mK or more.

The ceramic material may include ceramics such as $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and AlN. The thermal conductive material may include a component such as carbon (C), CNT, or the like. The thermal spreader may be included in the insulating member 151 with 1-99 wt %, so that the thermal spreading efficiency may be increased by 50% or more.

The insulating member 151 may be formed by mixing a polymer material with ink or a paste, and the mixing scheme of the polymer material may employ a ball mill, a planetary ball mill, impeller mixing, a bead mill, a basket mill, or the like. In this case, a solvent and a dispersant may be used for uniform dispersion, and the solvent may be added to adjust viscosity.

The solvent may include one selected from the group consisting of water, methanol, ethanol, isopropanol, butyl-cabitol, MEK, toluene, xylene, diethyleneglycol (DEG), formamide (FA), α-terpineol (TP), γ-butylrolactone (BL), Methylcellosolve (MCS), Propylmethylcellosolve (PM), and a combination thereof. To reinforce the coupling force between particles, silane-based additives may be added, Next, as illustrated in FIG. 13, a first mask 191 is formed on the insulating member 151, and a first hole B and a second hole B2 are formed in an area for a third electrode and a fourth electrode, so that top surfaces of the first electrode 135 and the second electrode 137 may be exposed. The first mask 191 may be a stencil mask, but the embodiment is not limited thereto.

According to the embodiment, when the insulating member 151 is positive photosensitive resin, as the exposed area of the insulating member 151 reacts to light and thus is removed, the top surfaces of the first electrode 135 and the second electrode 137 may be exposed, but the embodiment is not limited thereto.

Next, as shown in FIG. 14, third electrodes 141 and 141a and fourth electrodes 143 and 143a may be formed in a first recess B1 and a second recess B2.

According to the embodiment, after the first mask 191 is removed, a second mask 192 may be formed and may be a stencil mask.

The horizontal width of the exposed second mask 192 may be wider than the horizontal width of the first electrode 135 or the second electrode 137, or the horizontal width of the first part 141 of the third electrode or the first part 143 of the fourth electrode. Accordingly, the second part 141a of the third electrode or the second part 143a of the fourth electrode may be wider than the horizontal width of the first part 141 of the third electrode or the first part 143 of the fourth electrode. The first part 141 of the third electrode, the first part 143 of the fourth electrode, the second part 141a of the third electrode, and the second part 143a of the fourth electrode may be formed through a screen printing process.

In addition, as shown in drawings, when the third electrodes 141 and 141a or the fourth electrodes 143 and 143a are formed without removing the first mask 181, and when the first part 141 of the third electrode or the first part 143 of the fourth electrode is formed through a screen printing process, some electrode materials may be formed on the first part 141 of the third electrode or the first part 143 of the fourth electrode, so that the second part 141a of the third electrode or the second part 143a of the fourth electrode may be formed.

The first part 141 of the third electrode, the second part 141a of the third electrode, the first part 143 of the fourth electrode, and the second part 143a of the fourth electrode may be formed of the same electrode material.

For example, the first part 141 of the third electrode, the second part 141a of the third electrode, the first part 143 of the fourth electrode, and the second part 143a of the fourth electrode may be formed of a metallic paste material serving as an electrode material. For example, the metallic paste material may include any one of AuSi, AuGe, AuSn, PbIn, SnCu, SnCuNi, SnAg, SnAgCu, SnAgCuSb, SnPb, and BiSn, but the embodiment is not limited thereto.

According to the embodiment, the third and fourth electrodes 141, 141a, 143, and 143a may be formed through a metal paste method using a screen printing process. For example, the metal paste method using the screen printing process allows a connection electrode process within about 5 minutes and thus mass production is possible. In addition, excellent products may be reproduced, so that high quality products may be provided.

According to the embodiment, the length H1 of the first part 141 of the third electrode may be longer than a length H2 of the first part 143 of the fourth electrode.

The feature of the light emitting device according to the embodiment will be described with reference to FIG. 14.

According to the embodiment, the third electrodes 141 and 141a or the fourth electrodes 143 and 143a include the second part 141a of the third electrode or the second part 143a of the fourth electrode extending along at least one lateral side, thereby widely ensuring the horizontal width of the second part 141a of the third electrode or the second part 143a of the fourth electrode making contact with the first pad electrode 173 or the second pad electrode 174 in the subsequent packaging process to increase a coupling force. Accordingly, the physical reliability and the electrical reliability may be increased In addition, according to the embodiment, the horizontal width W15 of the second part 141a of the third electrode or the horizontal width W25 of the second part 143a of the fourth electrode is wider than of the horizontal width W11 of the first electrode 135 or the horizontal width W21 of the second electrode 137, thereby improving electrical performance.

According to the embodiment, the second part 141a of the third electrode or the second part 143a of the fourth electrode may be formed of a material the same as that of the first part 141 of the third electrode or the first part 143 of the fourth electrode. Accordingly, even if the temperature of the light emitting device or the lighting device package is increased, the second part 141a of the third electrode or the second part 143a of the fourth electrode have the same thermal expansion coefficients as those of the first part 141 of the third electrode or the first part 143 of the fourth electrode. Accordingly, the electrical reliability may be increased.

Accordingly, according to the embodiment, the second part 141a of the third electrode or the second part 143a of the fourth electrode is formed in contact with the top surface of the insulating member 151 to increase the rigidity of the physical structure. Therefore, the physical coupling and the electrical reliability may be improved between the first electrode 135 and the third electrodes 141 and 141a and between the second electrode 137 and the fourth electrodes 143 and 143a.

In addition, as shown in FIG. 2, according to the second embodiment, the first side electrode 135a or the second side electrode 137a extending along at least one lateral side of the first electrode 135 or the second electrode 137 is included, thereby reflecting light emitted from the light emitting device upward the light emitting device package by the first side electrode 135a or the second side electrode 137a to improve light extraction efficiency so that the light efficiency is improved, and thereby effectively radiating heat emitted from the light emitting device to the first electrode 135 or the second electrode 137 by the first side electrode 135a or the second side electrode 137a to significantly improve a heat radiation characteristic.

In addition, according to the second embodiment, a light extraction pattern P is provided on the first substrate 111 to improve light extraction efficiency. In addition, according to the embodiment, the light extraction pattern may be formed on the first conductive semiconductor layer 115 exposed after the first substrate 111 is removed, but the embodiment is not limited thereto.

Next, as shown in FIG. 15, according to the embodiment, the light emitting device 100 may be mounted on the module substrate 170 in a flip-chip scheme, but the embodiment is not limited thereto.

The module substrate 170 may be a printed circuit board (PCB) including a circuit pattern (not shown). For example, the module substrate 170 may include resin-based PCB, a metal core PCB (MCPCB) or a flexible PCB (FPCB), but the embodiment is not limited thereto.

According to the embodiment, the module substrate 170 may include the package substrate 171 and the insulating layer 172 and may include a first pad electrode 171 and a second pad electrode 174 formed through the insulating layer 172. The first pad electrode 173 and the second pad electrode 174 may supply power to the light emitting device 100.

The protective layer 175 is formed on an area of the insulating layer 172 except for the first pad electrode 173 and the second pad electrode 174. The protective layer 175 may serve as a solder resist layer and may include a white or green protective layer. The protective layer 175 may efficiently reflect light to increase an amount of reflected light.

According to the embodiment, a horizontal width W17 of the first pad electrode is wider than a horizontal width W11 of the first electrode or a horizontal width W13 of the first part 141 of the third electrode, thereby increasing the contact area between the first pad electrode 173 and the second part 141a of the third electrode, so that the physical reliability and the electrical reliability may be increased According to the embodiment, a horizontal width W27 of the second pad electrode is wider than a horizontal width W21 of the second electrode or a horizontal width W23 of the first part 143 of the fourth electrode, thereby increasing the contact area between the second pad electrode 174 and the second part 143a of the fourth electrode, so that the physical reliability and the electrical reliability may be increased According to the embodiment, the light emitting device or the light emitting device package may be applied to a backlight unit, a lighting unit, a display device, an indication device, a lamp, a streetlamp, a vehicle lighting device, a vehicle display device, a smart watch, or the like, but the embodiment is not limited thereto.

FIG. 16 is an exploded perspective view of a lighting system, according to the embodiment.

According to the embodiment, a lighting device may include a cover 2100, a light source module 2200, a heat radiator 2400, a power supply unit 2600, an inner case 2700, and a socket 2800. In addition, the light device according to the embodiment may further include at least one of a member 2300 and a holder 2500. The light source module 2200 may include a light emitting device 100, 103, or 104, or a light emitting device package, 200, 202, 203, or 204.

The light source module 2200 may include a light source 2210, a connection plate 2230, and a connector 2250. The member 2300 is provided on a top surface of the heat radiator 2400 and has guide grooves 2310 into which a plurality of light sources 2210 and the connector 2250 are inserted.

The holder 2500 covers a receiving groove 2719 of an insulating part 2710 of an inner case 2700. Accordingly, the power supply part 2600 received in the insulating part 2710 of the inner case 2700 is sealed. The holder 2500 has a guide protrusion 2510.

The power supply part 2600 may include a protrusion 2610, a guide part 2630, a base 2650, and an extension part 2670. The inner case 2700 may include a molding part and the power supply part 2600. The molding part is formed by hardening molding liquid, and the power supply part 2600 may be fixed into the inner case 2700 by the molding part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device comprising:
   a light emitting structure including a first conductive semiconductor layer, an active layer, a second conductive semiconductor layer;
   a first electrode electrically connected with the first conductive semiconductor layer;
   a second electrode electrically connected with the second conductive semiconductor layer;
   a third electrode provided on the first electrode;
   a fourth electrode provided on the second electrode;
   an insulating member overlapped with the light emitting structure in a vertical direction;
   an insulating layer between the insulating member and the light emitting structure; and
   an extension electrode connected to a lateral surface of at least one of the first electrode and the second electrode and disposed between the insulating member and the insulating layer,
   wherein the third electrode includes a first part and a second part,
   wherein the first part is connected to the first electrode in the insulating member,
   wherein the second part is disposed on the first part and has a width wider than a width of the first part,
   wherein the fourth electrode includes a third part and a fourth part,
   wherein the third part is connected to the second electrode in the insulating member,
   wherein the fourth part is disposed on the third part and has a width wider than a width of the third part,
   wherein the insulating member is disposed around the first electrode, the second electrode, the first part of the third electrode and the third part of the fourth electrode, and
   wherein the second part of the third electrode and the fourth part of the fourth electrode are spaced apart from each other on a top surface of the insulating member.

2. The light emitting device of claim 1, wherein the second part of the third electrode and the fourth part of the fourth electrode are disposed at a higher than the top surface of the insulating member, and
   wherein the insulating member is disposed between the extension electrode and the second part of the third electrode and between the extension electrode and the fourth part of the fourth electrode.

3. The light emitting device of claim 1, wherein the first part of the third electrode and the second part of the third electrode include mutually identical materials, and the third part of the fourth electrode and the fourth part of the fourth electrode include mutually identical materials, and
   wherein the second part and the fourth part have the same thickness.

4. The light emitting device of claim 1, wherein the first part of the third electrode has a height higher than a height of the third part of the fourth electrode.

5. The light emitting device of claim 1, wherein the insulating member includes at least one of a photoresistive material, resin, or epoxy, and
   wherein the first electrode and the fourth electrode includes at least one of AuSi, AuGe, AuSn, PbIn, SnCu, SnCuNi, SnAg, SnAgCu, SnAgCuSb, SnPb, or BiSn.

6. The light emitting device of claim 1, wherein the extension electrode includes a first extension electrode and a second extension electrode,
   wherein the first extension electrode extends from a different sides of the first electrode; and
   wherein the second extension electrode extends from a different sides of the second electrode.

7. The light emitting device of claim 6, wherein the extension electrode contacts a top surface of the insulating layer and a bottom surface of the insulating member.

8. The light emitting device of claim 7, wherein an area of a top surface of the first extension electrode is smaller than an area of a top surface of the second extension electrode.

9. The light emitting device of claim 7, wherein a width of a top surface of the first extension electrode is smaller than a width of a top surface of the second extension electrode in a horizontal direction.

10. The light emitting device of claim 7, comprising an electrode layer between the second conductive semiconductor layer and the insulating layer,
    wherein the electrode layer overlaps the second extension electrode in the vertical direction, and
    wherein the insulating layer is disposed between the second extension electrode and the second layer.

11. The light emitting device of claim 1, further comprising:
    a through electrode disposed through the second conductive semiconductor layer and the active layer and electrically connected with the first conductive semiconductor layer, wherein the through electrode is electrically connected with the first electrode.

12. The light emitting device of claim 11, wherein a distance between the first electrode and the second electrode is shorter than a distance between the second part of the third electrode and the fourth part of the fourth electrode.

13. A light emitting device package comprising:
    a package substrate;
    a first pad electrode and a second pad electrode provided on the package substrate; and a light emitting device according to claim 1, which is provided on the package substrate and electrically connected with the first pad electrode and the second pad electrode.

14. The light emitting device of claim 13, wherein a horizontal width of the first pad electrode is wider than a horizontal width of the first electrode, and
wherein a horizontal width of the second pad electrode is wider than a horizontal width of the second electrode.

15. The light emitting device of claim 13, wherein a thickness of the extension electrode is smaller than a thickness of each of the first and second electrodes, and
wherein an outer surface of the extension electrode is exposed to an lateral surface of the insulating member.

16. The light emitting device of claim 13, wherein the first part of the third electrode, the third part of the fourth electrode and the insulating member have the same thickness.

17. The light emitting device of claim 1, wherein the light emitting structure includes a recess around an outer region thereof,
wherein a portion of the insulating layer extends to the recess, and
wherein the extension electrode is disposed on the portion of the insulating layer.

18. The light emitting device of claim 17, wherein the extension electrode includes a first extension electrode extending from the first electrode to an first outer region of the recess and a second extension electrode extending from the second electrode to an second outer region of the recess.

19. The light emitting device of claim 18, wherein the first extension electrode and the second extension electrode are disposed on an opposite sides of the light emitting structure from each other.

20. The light emitting device of claim 18, wherein a thickness of the first and second electrodes is thicker than a thickness of the extension electrode, and
wherein an interval between the first electrode and the second electrode is smaller than an interval between the second part of the third electrode and the fourth part of the fourth electrode.

* * * * *